United States Patent
Zhou et al.

(10) Patent No.: US 8,483,007 B2
(45) Date of Patent: Jul. 9, 2013

(54) ACOUSTIC SENSOR SYSTEM FOR DETECTING ELECTRICAL CONDUCTIVITY FAULTS IN AN ELECTRICAL DISTRIBUTION SYSTEM

(75) Inventors: Xin Zhou, Franklin Park, PA (US); Robert Yanniello, Asheville, NC (US); Dale L. Gass, Brown Deer, WI (US); Birger Pahl, Milwaukee, WI (US); Thomas J. Schoepf, Whitefish Bay, WI (US)

(73) Assignee: Eaton Corporation, Cleveland, OH (US)

( * ) Notice: Subject to any disclaimer, the term of this patent is extended or adjusted under 35 U.S.C. 154(b) by 396 days.

(21) Appl. No.: 12/906,244

(22) Filed: Oct. 18, 2010

(65) Prior Publication Data

US 2012/0092965 A1 Apr. 19, 2012

(51) Int. Cl.
*G01V 13/00* (2006.01)
(52) U.S. Cl.
CPC ................................ *G01V 13/00* (2013.01)
USPC .......................................................... 367/13
(58) Field of Classification Search
USPC .......................................................... 367/13
See application file for complete search history.

(56) References Cited

U.S. PATENT DOCUMENTS

| | | | | |
|---|---|---|---|---|
| 5,421,200 A | * | 6/1995 | Casarcia et al. | 73/632 |
| 5,515,728 A | * | 5/1996 | Casarcia et al. | 73/623 |
| 6,300,767 B1 | | 10/2001 | Kliman et al. | |
| 6,798,211 B1 | * | 9/2004 | Rockwell et al. | 324/527 |
| 7,148,696 B2 | | 12/2006 | Zhou et al. | |
| 7,403,129 B2 | | 7/2008 | Zhou et al. | |
| 7,411,403 B2 | | 8/2008 | Zhou | |
| 2002/0130668 A1 | * | 9/2002 | Blades | 324/536 |
| 2006/0164097 A1 | * | 7/2006 | Zhou et al. | 324/529 |
| 2006/0254355 A1 | * | 11/2006 | Zhou | 73/579 |
| 2007/0263329 A1 | * | 11/2007 | Zhou et al. | 361/42 |
| 2009/0161270 A1 | * | 6/2009 | Beatty et al. | 361/42 |
| 2010/0007447 A1 | * | 1/2010 | Mernyk | 335/7 |
| 2010/0321838 A1 | * | 12/2010 | Wu et al. | 361/42 |
| 2011/0114412 A1 | * | 5/2011 | De Lorenzo et al. | 181/101 |
| 2011/0153236 A1 | * | 6/2011 | Montreuil et al. | 702/59 |

FOREIGN PATENT DOCUMENTS

WO WO 2009129959 A1 * 10/2009

OTHER PUBLICATIONS

European Patent Office, "extended European search report", Nov. 29, 2012, 6 pp.

* cited by examiner

*Primary Examiner* — Isam Alsomiri
*Assistant Examiner* — James Hulka
(74) *Attorney, Agent, or Firm* — Eckert Seamans Cherin & Mellott, LLC; Kirk D. Houser

(57) ABSTRACT

An acoustic sensor system is for an electrical distribution system having a number of phases. The acoustic sensor system comprises: a plurality of sets of acoustic sensors structured to detect an electrical conductivity fault of the electrical distribution system. Each of the plurality of sets includes a number of acoustic sensors. Each of the number of acoustic sensors is for a corresponding one of the number of phases of the electrical distribution system.

17 Claims, 9 Drawing Sheets

ACOUSTIC SENSOR SYSTEM FOR DETECTING ELECTRICAL CONDUCTIVITY FAULTS IN AN ELECTRICAL DISTRIBUTION SYSTEM

CROSS-REFERENCE TO RELATED APPLICATIONS

This application is related to commonly assigned, copending U.S. patent application Ser. No. 12/906,256, filed Oct. 18, 2010, entitled "ACOUSTIC APPARATUS AND ACOUSTIC SENSOR APPARATUS INCLUDING A CLAMP"; commonly assigned, copending U.S. patent application Ser. No. 12/906,258, filed Oct. 18, 2010, entitled "ACOUSTIC SENSOR SYSTEM, ACOUSTIC SIGNATURE SIMULATOR, AND ELECTRICAL DISTRIBUTION SYSTEM"; and commonly assigned, copending U.S. patent application Ser. No. 12/906,259, filed Oct. 18, 2010, entitled "ACOUSTIC APPARATUS AND ACOUSTIC SENSOR APPARATUS INCLUDING A FASTENER".

BACKGROUND

1. Field

The disclosed concept pertains generally to acoustic noise induced by electrical conductivity faults and, more particularly, to acoustic sensor systems for electrical distribution systems.

2. Background Information

There is no known cost effective technology and product to detect loose electrical connections in electrical distribution systems. An infrared imaging scan has been widely used to find such loose electrical connections, but this does not provide continuous (e.g., "24-7" or 24 hours a day, seven days a week) detection and monitoring, is limited to detecting only joints within view, and exposes the operator to potentially hazardous conditions.

Other known products employ temperature sensing at each electrical joint. However, this has not been widely adopted due to cost.

It is believed to be almost impossible to extract a loose electrical connection signature from both current and voltage due to the relatively small voltage drop across a loose electrical connection (except when this escalates into a major arc fault or arc flash event) except by monitoring voltage drops at each electrical connection.

U.S. Pat. No. 7,148,696 discloses that an acoustic signature is generated by an arc fault or a glowing contact. An acoustic sensor "listens" directly to signature noise generated by a fault, no matter what type of electrical load is present or in what kind of environment in which the fault is generated. The acoustic noise generated by an arc fault or a glowing contact has an acoustic signal at one or more specific wavelengths that is (are) directly related to either the basic characteristics of, for example, the arc and its resonance frequency or the AC power source modulated frequency and its harmonics. The acoustic signal of an arc fault is detected by an acoustic sensor. A resulting trip signal is sent to a trip mechanism to, for example, trip open separable contacts, in order to interrupt the arc fault.

There is a need for a cost effective technology and product to effectively detect electrical conductivity faults, such as loose electrical connections, at their earliest stage in order to prevent potential equipment damage and/or personal injury.

There is room for improvement in acoustic sensor systems.

There is also room for improvement in the detection of electrical conductivity faults.

SUMMARY

These needs and others are met by embodiments of the disclosed concept in which a plurality of acoustic sensors detect electrical conductivity faults of an electrical distribution system.

In accordance with one aspect of the disclosed concept, an acoustic sensor system is for an electrical distribution system having a number of phases. The acoustic sensor system comprises: a plurality of sets of acoustic sensors structured to detect an electrical conductivity fault of the electrical distribution system, wherein each of the plurality of sets includes a number of acoustic sensors, and wherein each of the number of acoustic sensors is for a corresponding one of the number of phases of the electrical distribution system.

The electrical distribution system may comprise a plurality of bus bars and a plurality of zones; and each of the number of acoustic sensors may be coupled to a corresponding one of the bus bars at a corresponding one of the zones of the electrical distribution system, in order that the plurality of sets of acoustic sensors are operatively associated with all of the bus bars and all of the zones of the electrical distribution system.

Each of the plurality of sets of acoustic sensors may be structured to communicate with a remote station using a communication system to send an indication of the detected electrical conductivity fault and a corresponding zone of the plurality of zones upon detection of the electrical conductivity fault.

The electrical distribution system may be a three-phase electrical distribution system comprising a plurality of bus bars and a plurality of zones; and a corresponding set of the plurality of sets of acoustic sensors may be coupled to three of the bus bars at a corresponding one of the zones of the three-phase electrical distribution system, in order that the plurality of sets of acoustic sensors are operatively associated with all of the bus bars and all of the zones of the three-phase electrical distribution system.

The electrical distribution system may be partitioned into a plurality of zones by a plurality of circuit interrupters that block acoustic propagation.

Each of the plurality of sets of acoustic sensors may be further structured to periodically send a communication to a remote station using a communication system, in order to confirm normal operation thereof.

At least one of the number of acoustic sensors may be structured to clamp-on an electrical power conductor of the electrical distribution system.

As another aspect of the disclosed concept, an acoustic sensor system is for an electrical distribution system comprising a plurality of zones, each of the zones having a number of electrical connections. The acoustic sensor system comprises: a plurality of acoustic sensors structured to detect an electrical conductivity fault of the number of electrical connections; a remote station; and a communication system between the acoustic sensors and the remote station, wherein each of the acoustic sensors is structured to communicate with the remote station using the communication system to send an indication of the detected electrical conductivity fault and a corresponding zone of the plurality of zones upon detection of the electrical conductivity fault.

At least one of the acoustic sensors may be structured to clamp-on an electrical power conductor.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
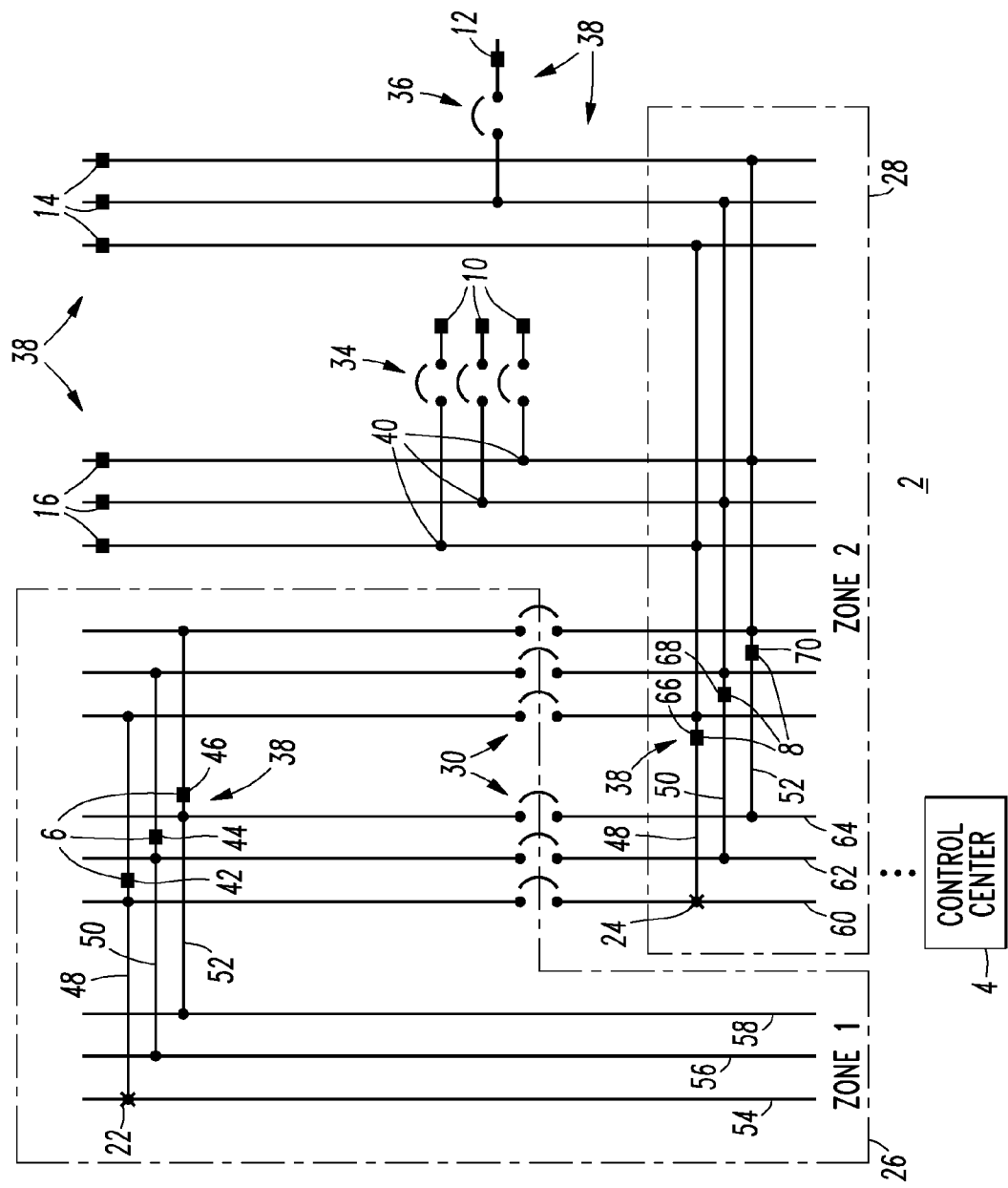
FIG. 1 is a block diagram in schematic form of switchgear including a protective relay and acoustic sensors in accordance with embodiments of the disclosed concept.

As employed herein, the term "number" shall mean one or an integer greater than one (i.e., a plurality).

As employed herein, the term "processor" shall mean a programmable analog and/or digital device that can store, retrieve, and process data; a computer; a workstation; a personal computer; a microprocessor; a microcontroller; a microcomputer; a central processing unit; a mainframe computer; a mini-computer; a server; a networked processor; or any suitable processing device or apparatus.

As employed herein, the term "acoustic" shall mean one or more sounds that are subsonic, sonic and/or ultrasonic.

As employed herein, the term "electrical power conductor" shall mean a wire (e.g., solid; stranded; insulated; non-insulated), a copper conductor, an aluminum conductor, a suitable metal conductor, an electrical bus bar, or other suitable material or object that permits an electric current to flow easily.

As employed herein, the term "electrical joint" shall mean a structure that electrically and mechanically connects a plurality of electrical conductors.

As employed herein, the term "lug" shall mean a terminal or other electrically conductive fitting to which two or more electrical conductors are electrically and mechanically connected.

As employed herein, the term "electrical conductivity fault" shall mean an arc fault, or a loose or other intermittent electrical connection of an electrical conductor, an electrical joint and/or a lug that leads to a glowing contact.

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

As employed herein, the term "acoustic coupler" shall mean a bolt; an adhesive; a clamp; a fastener; or another suitable coupling mechanism to hold an electrical conductor and an acoustic sensor or an acoustic generator together to allow effective acoustic transmission with or without an electrical connection.

As employed herein, the term "signature" shall mean something that serves to set apart or identify another thing. For example, an acoustic signature serves to set apart or identify an electrical conductivity fault.

As employed herein, the term "fastener" shall mean rivets, adhesives, screws, bolts and the combinations of bolts and nuts (e.g., without limitation, lock nuts) and bolts, washers and nuts.

As employed herein, the term "bolt" shall mean a device or apparatus structured to bolt two or more parts together so as to hold them firmly, such as by bolting an electrical power conductor and a housing including an insulation spacer. A bolt can be, for example, a metal rod or pin for fastening objects together that usually has a head at one end and a screw thread at the other end and is secured by a nut.

As employed herein, the term "clamp" shall mean a device or apparatus structured to bind or constrict or to press two or more parts together so as to hold them firmly, such as by holding or compressing an electrical power conductor and an insulation spacer. The term "clamp" expressly excludes a fastener.

The disclosed concept is described in association with, for example and without limitation, single-phase and three-phase electrical distribution equipment and systems, such as low voltage switchgear, low voltage switch boards, low voltage panel boards, motor control centers and medium voltage switchgear. However, it will be appreciated that the disclosed concept can be employed with a wide range of other applications, such as busway electrical systems for commercial or industrial facilities, aerospace applications and electric vehicle applications having any number of phases. Also, the disclosed concept can be applied to residential applications. In residential applications, the acoustic signal has a relatively high attenuation rate with relatively small electrical conductors; hence, each acoustic sensor can cover only a relatively short range of the electrical wiring system.

FIG. 1 shows an electrical distribution system, such as switchgear 2, including a control center 4 and acoustic sensors 6,8,10,12,14,16. In the example switchgear 2, circuit interrupters, such as circuit breakers 30,34,36, act as isolators or absorbers of acoustic signals since, for example, the braided flexible conductor or shunt (not shown) electrically connecting the movable contact arm (not shown) and the circuit breaker load side conductor (not shown) acts like an acoustic isolator due to the relatively high attenuation rate of the acoustic signal when it goes through the shunt. Hence, an acoustic signal from the load (line) side cannot pass through the circuit breaker to reach to the line (load) side. Since the shunt is an acoustic attenuator, any acoustic signal, regardless if generated from an actual electrical conductivity fault, will not pass through the circuit breaker, thus dividing the switchgear 2 into acoustically isolated zones, such as 26,28.

An example acoustic sensor system 38 provides electrical conductivity fault detection and zone location detection in the example switchgear 2. The example acoustic sensors 6,8,10, 12 are installed at various locations within the example switchgear 2 in such a way that each acoustic sensor covers a certain section within the electrical system. Each section is determined by the location of electrical switching devices (e.g., without limitation, circuit interrupters, such as circuit breakers or contactors) that act as acoustic isolators or absorbers of acoustic signals within the electrical distribution system. This makes it possible that no more than one acoustic sensor will detect the acoustic signal from the same electrical conductivity fault, which will provide electrical conductivity fault zone location detection.

In FIG. 1, an example loose electrical connection 24 is detected by sensor 8 in zone 28 (zone #2). However, an example loose electrical connection 22 is not detected by sensor 8 due to blocking by circuit breaker 30. For example, the loose electrical connections 22,24 can occur at, for example, over-heated electrical joints, such as, for example, 40. Sensors 14,16 are unable to detect the loose electrical connection 24 due to the attenuation of the acoustic signal, or may not be able to confirm that the loose electrical connection 24 is in zone 28 (zone #2) due to the relatively low level of noise detected by those sensors 14,16 when compared with the relatively higher level of noise detected by sensor 8 in zone 28. Hence, the example switchgear 2 can also be partitioned by the distance that an acoustic signal can travel without significant acoustic attenuation so that, for example, a corresponding one of the sensors 8,14,16 can still detect the acoustic signal.

The example circuit breaker 34 is a three-pole tie circuit breaker.

The example acoustic sensor system 38 is for a three-phase electrical distribution system, such as the example switchgear 2, although any number of phases can be employed. The acoustic sensor system 38 includes a plurality of sets of acoustic sensors, such as, for example, 6,8, structured to detect an electrical conductivity fault of the example switchgear 2. Each of these plurality of sets includes three acoustic sensors, such as sensors 42,44,46. Each of the three acoustic sensors, such as sensors 42,44,46, is for a corresponding phase, such as phases 48,50,52, respectively, of the example switchgear 2.

The example switchgear 2 includes a plurality of bus bars, such as 54,56,58,60,62,64, and a plurality of zones, such as the zones 26,28. For example, each of the three acoustic sensors 42,44,46 is coupled to a corresponding one of the bus bars 54,56,58, respectively, at the corresponding zone 26. Similarly, each of the three acoustic sensors 66,68,70 is coupled to a corresponding one of the bus bars 60,62,64, respectively, at the corresponding zone 28. In this manner, the sets of acoustic sensors, such as, for example, 6,8, are operatively associated with all of the bus bars, such as, for example, 54,56,58,60,62,64, and all of the zones, such as, for example, 26,28, of the example three-phase switchgear 2. Each of the example zones 26,28 is a particular location or section of the example three-phase switchgear 2.

Figure 2:
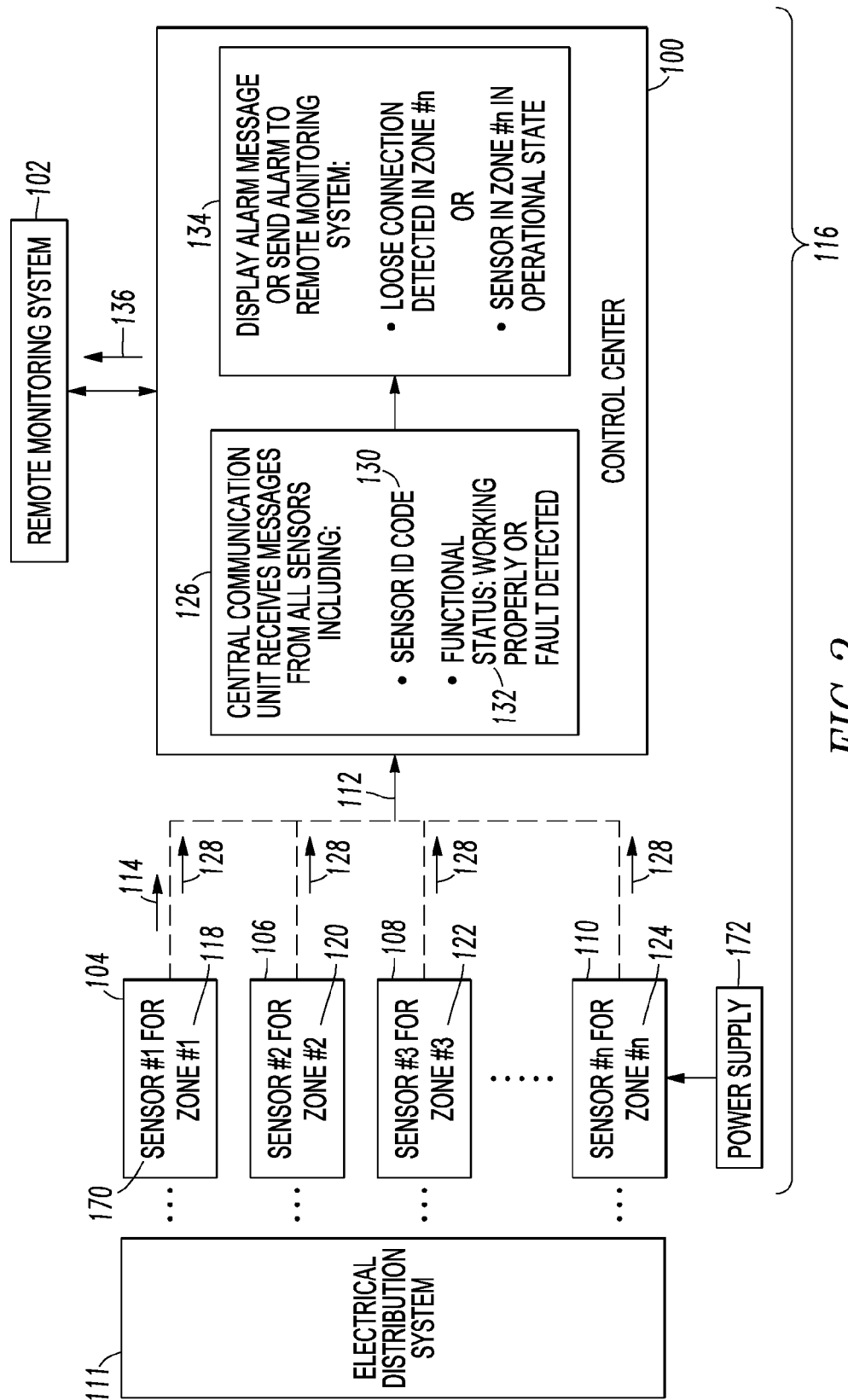
FIG. 2 is a block diagram of a control center in accordance with another embodiment of the disclosed concept.

Referring to FIG. 2, a remote station, such as example control center 100, is shown. The example control center 100 can be part of or cooperate with a remote monitoring system 102. Alternatively, the remote station can be a protective relay (not shown), which can include some or all of the functions of the control center 100. The control station 100, for example and without limitation, may be dedicated for the purposes of receiving and communicating acoustic detections or may be part of another device, such as a trip unit, a protective relay or a meter.

The example control center 100 can be operatively associated with a plurality of different acoustic sensors 104,106, 108,110 for a plurality of different zones 118,120,122,124, respectively (see, also, the zone (zone #1) 26 and the zone (zone #2) 28 of FIG. 1). It will be appreciated that the acoustic sensors 104,106,108,110 can be, for example and without limitation, single-phase acoustic sensors for a single-phase electrical distribution system 111, or three-phase acoustic sensors, such as the example acoustic sensors 6,8,14,16 for the example three-phase switchgear 2 of FIG. 1. Any number of phases can be employed.

Each of the example acoustic sensors 104,106,108,110 is structured to communicate with the example control center 100 using a communication system 112 between these acoustic sensors 104,106,108,110 and the control center 100 to send an indication of a detected electrical conductivity fault (not shown in FIG. 2, but see the electrical conductivity faults 22,24 of FIG. 1) and a corresponding zone of the plurality of zones (118,120,122,124, respectively) upon detection of the electrical conductivity fault.

Each of the example acoustic sensors 104,106,108,110 is further structured to periodically send a communication, such as a message 114, to the example control center 100 using the communication system 112, in order to confirm normal operation thereof. Each of the example acoustic sensors, such as 104, can periodically transmit the message 114 such as once every 30 minutes, although any suitable time period can be employed. The example communication system 112 is selected from the group consisting of a wired communication system and a wireless communication system.

The various acoustic sensors 104,106,108,110, the communication system 112, and the example control center 100 form an acoustic sensor system 116 for the electrical distribution system 111 comprising the plurality of zones 118,120, 122,124, each of which has a number of electrical connections (not shown in FIG. 2, but see the example electrical joints 40 of FIG. 1). The acoustic sensors 104,106,108,110, like the acoustic sensors 6,8,10,12,14,16 of FIG. 1, are structured to detect an electrical conductivity fault of the electrical connections of the various zones 118,120,122,124. Each of the acoustic sensors 104,106,108,110 is structured to communicate with the example control center 100 using the communication system 112 to send an indication of a detected electrical conductivity fault and a corresponding zone of the plurality of zones 118,120,122,124 upon detection of the electrical conductivity fault. For example, the example control center 100 includes a central control unit 126 (e.g., a processor) that receives messages, such as 128, from all of the acoustic sensors 104,106,108,110. These messages 128 include a sensor ID code 130 and a functional status 132, which indicates that the corresponding acoustic sensor, as identified by the corresponding sensor ID code 130, is either working properly or has detected a fault, such as an electrical conductivity fault. In turn, the central control unit 126 can output an alarm message to a display 134, and/or send an alarm 136 to the remote monitoring system 102. The display 134 and/or the alarm 136 can then indicate either that an electrical conductivity fault was detected in a corresponding zone, or that the corresponding acoustic sensor is in an operational state.

Figure 3:
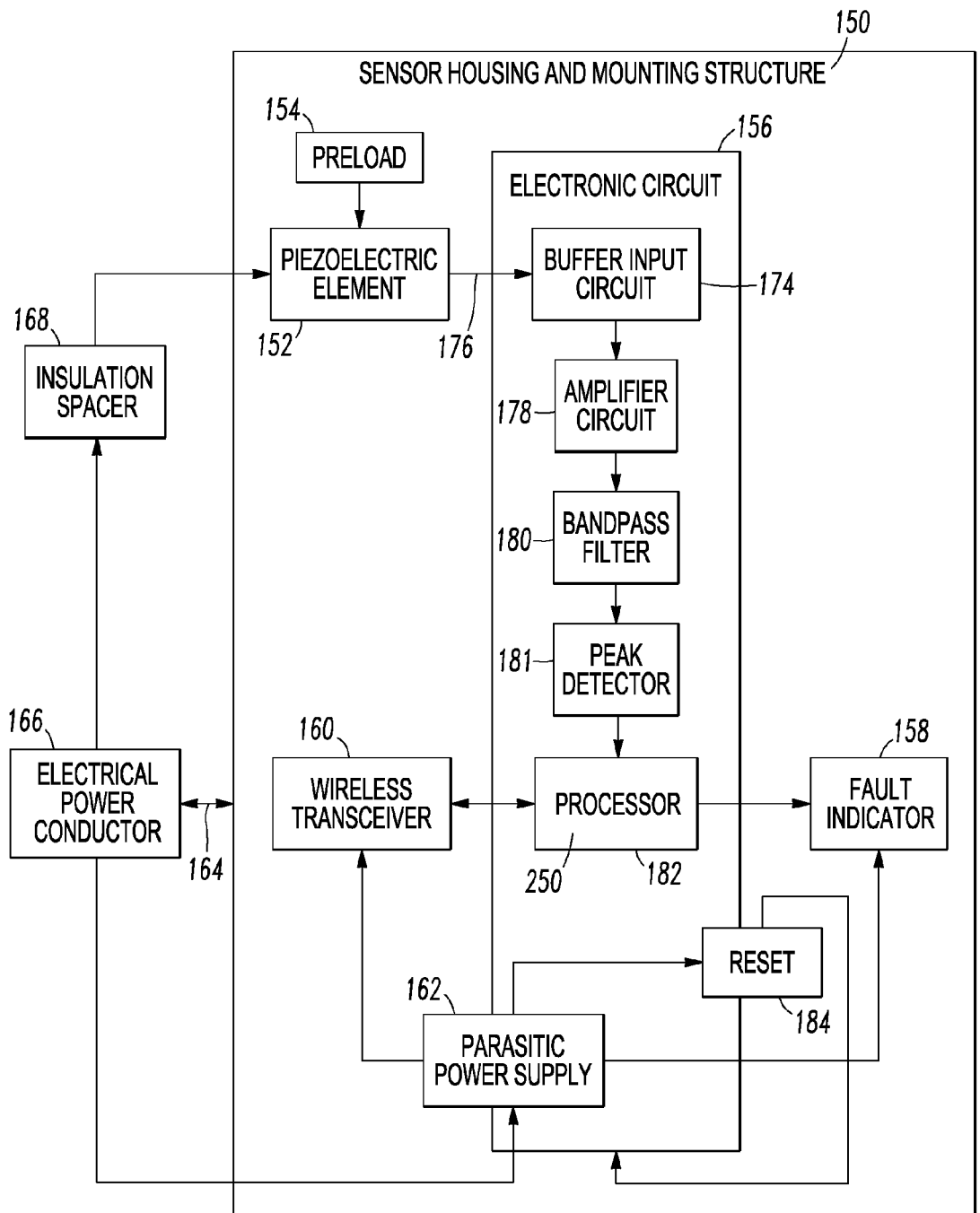
FIG. 3 is a block diagram of one of the acoustic sensors of FIG. 1.

FIG. 3 shows one of the acoustic sensors 42,44,46,66,68, 70 of FIG. 1. This includes a sensor housing and mounting structure 150, a piezoelectric element 152, an optional preload 154, an electronic circuit 156, a fault indicator 158, a wireless transceiver 160 and a power supply 162. The preload 154, which is not required, compresses the piezoelectric element 152 under pressure in its assembly. The sensor housing and mounting structure 150 is suitably coupled, at 164, to an electrical power conductor 166 (e.g., of the example switchgear 2 of FIG. 1 or of the example electrical distribution system 111 of FIG. 2). The example piezoelectric element 152 is coupled to the electrical power conductor 166 by a suitable insulation spacer 168 or through the sensor housing by a suitable insulating spacer.

Although the power supply 162 is shown as being an example parasitic power supply (e.g., without limitation, employing a current transformer (CT) (not shown) that derives power from the energized electrical power conductor 166), it will be appreciated that a wide range of power supplies can be employed. The example parasitic power supply 162 includes a power harvesting capability such as by employing a number of power CTs to harvest electrical power when there is current flowing through the electrical power conductor 166. For example and without limitation, the sensor 104 of FIG. 2 employs a battery power supply 170 and the sensor 110 of FIG. 2 employs an external power source 172.

The wireless transceiver 160 of FIG. 3 provides a suitable wireless communication capability (e.g., without limitation, IEEE 802.11; IEEE 802.15.4; another suitable wireless transceiver or transmitter) to communicate the detection of an electrical conductivity fault to another location (e.g., without limitation, the example control center 100 of FIG. 2; a control console; a trip unit; a protective relay) to alert maintenance personnel of the fault and its zone location.

The electronic circuit 156 includes a buffer input circuit 174 that receives the output signal 176 from the piezoelectric element 152, an amplifier circuit 178, a bandpass filter 180, a peak detector 181 and a processor 182. A reset circuit 184 can reset the electronic circuit 156 after a power outage caused by the parasitic power supply 162 receiving insufficient power from the electrical power conductor 166.

Figure 4:
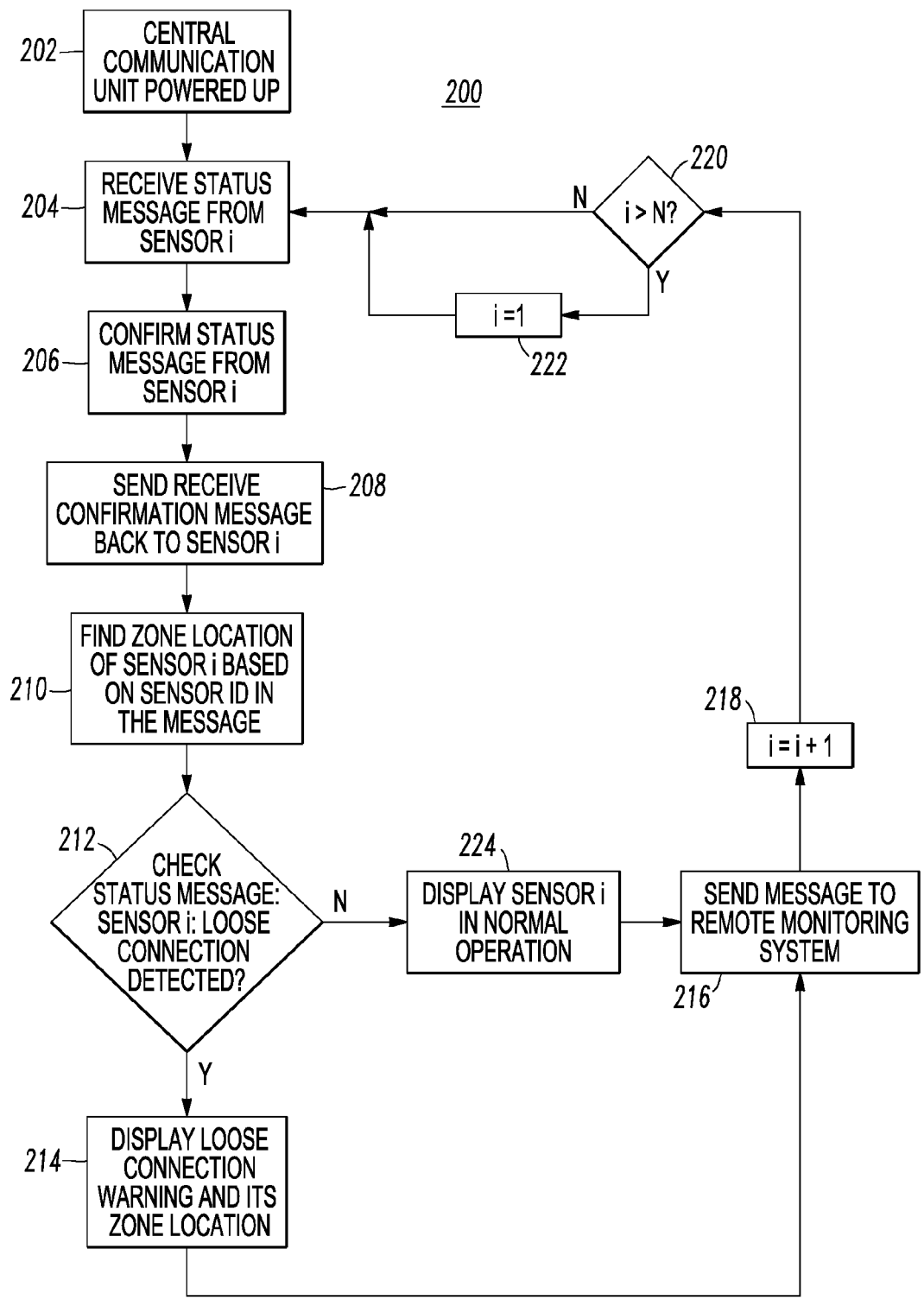
FIG. 4 is a flowchart of a routine for the central communication unit of FIG. 2.

FIG. 4 is a flowchart of a routine 200 for the central communication unit 126 of FIG. 2. First, at 202, the central communication unit 126 is powered up. Next, at 204, it receives a status message from "SENSOR i", which is one of the example acoustic sensors 104,106,108,110. Next, at 206, it confirms the status message from "SENSOR i" and, at 208, sends a receive confirmation message back to that particular sensor. Next, at 210, it finds the zone location of that particular sensor based on the sensor ID code 130 in the received status message. Then, at 212, it checks the received status message for an electrical conductivity fault, such as a loose connection. If a fault is indicated, then at 214, a loose connection warning, such as an alarm, is displayed along with its zone location. Next, at 216, a corresponding message is sent to the remote monitoring system 102. Then, at 218, an integer, i, is incremented to point to the next sensor (e.g., "SENSOR i+1"). Next, at 220, if the integer, i, is greater than a predetermined value (e.g., N is the count of the various acoustic sensors), then the integer, i, is reset to one at 222, after which step 204 is repeated. Otherwise, if the integer, i, is not greater than the predetermined value, then execution resumes at 204 with the integer, i, as was incremented at 218.

On the other hand, at 212, if the received status message is normal, then at 224, a normal status is displayed for the current sensor (e.g., "SENSOR i") along with its zone location. Then, step 216 is executed to send a corresponding message to the remote monitoring system 102. As was discussed above in connection with FIG. 2, each of the acoustic sensors 104,106,108,110 periodically transmits a normal status message to the example control center 100 using the communication system 112, in order to confirm normal operation thereof.

Figure 5A:
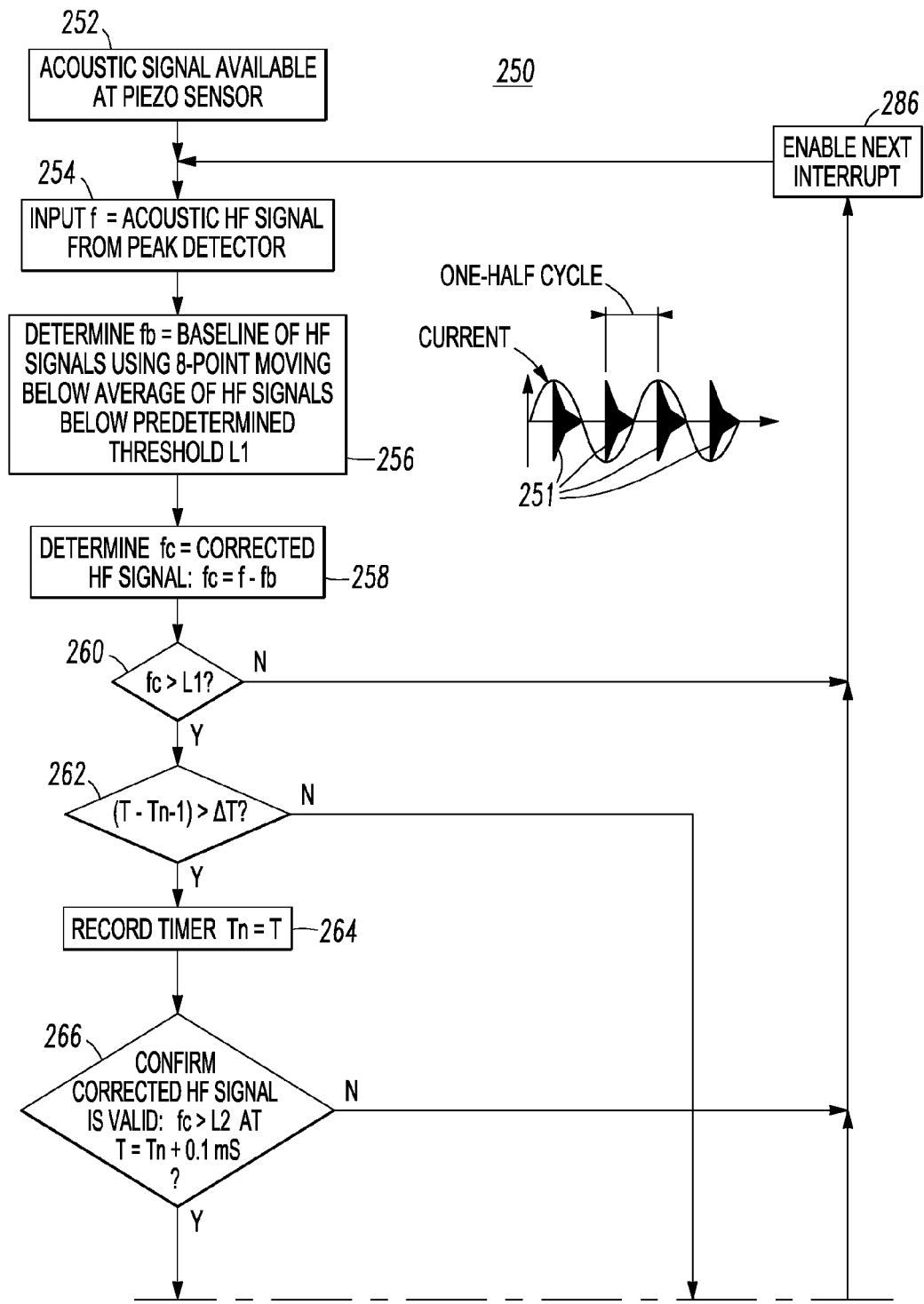
FIGS. 5A and 5B form a flowchart of a routine for the processor of FIG. 3.
Figure 5B:
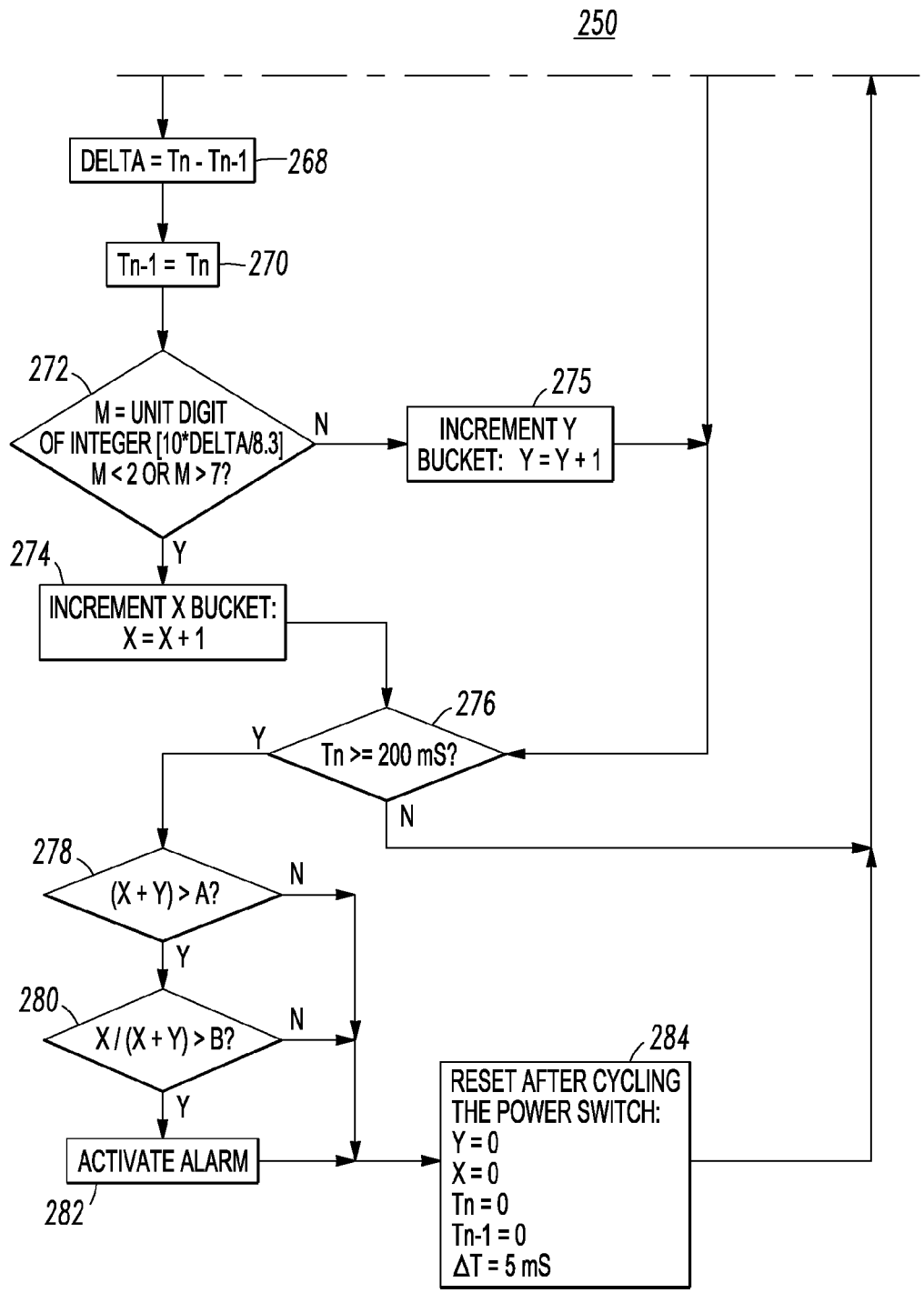

Referring to FIGS. 5A-5B, a routine 250 for the processor 182 of FIG. 3 is shown. The general operation of this routine 250 is to obtain output from the peak detector 181 of FIG. 3 and measure DELTA (step 268), the time difference between two adjacent signals from the peak detector 181. First, at 252, an acoustic signal is available at the piezoelectric element 152 and the peak acoustic signal therefrom is available at the peak detector 181. Next, at 254, the routine 250 inputs a signal, f, which is the acoustic high frequency (HF) signal from the peak detector 181.

Then, at 256, a value, fb, is determined, which is the baseline of the HF signals using, for example, an 8-point moving average of the HF signals below a predetermined threshold L1. Two L1 and L2 thresholds are employed by the routine 250 to confirm that acoustic wavelets 251 have the intended profile representative of an electrical conductivity fault. Non-limiting examples of L1 and L2 are 100 mV and 50 mV, respectively. Sometimes, the HF signal from the peak detector 181 has a relatively high noise level due to various reasons such as, for example, increased EMI noise. In order to avoid the effect of baseline noise level variation, step 256 seeks to take the noise level out of the measured signal by estimating the noise level using the example 8-point moving average on those HF signals below the predetermined threshold L1. The example 8-point moving average is the average value of the last example eight samples whose values are below the L1 threshold. Next, at 258, the corrected HF signal, fc, is determined from f−fb.

At 260, it is determined if fc is greater than L1. If so, then it is determined if T−Tn−1 is greater than ΔT (e.g., a predefined value such as 5 mS) at 262. T is the time from a suitable timer (not shown) (e.g., without limitation, an oscillator circuit (not shown) in the processor 182 of FIG. 3; a crystal oscillator (not shown) in the processor 182). DELTA is reset to zero at 284 (where Tn=Tn−1=0) after the routine 250 reaches its predetermined time period at 276. If the test passes at 262, then at 264, the timer value, T, is recorded as Tn. Tn=T means that time T is recorded as Tn when there is an acoustic signal coming out of the peak detector 181 that is higher than the L1 threshold. Next, step 266 confirms that the corrected HF signal is valid if fc is greater than L2 at T=Tn+0.1 mS. If so, then variable DELTA is set equal to Tn−Tn−1. Then, at 270, Tn−1 is set equal to Tn.

Next, at 272, it is determined if M is less than 2 or greater than 7, where M is the unit digit of integer [10*DELTA/8.3333]. This checks if DELTA is a multiple of 8.3333 mS (e.g., without limitation, DELTA/8.3333=2.1, then (DELTA/8.3333)×10=21, and M=1 which is less than 2. So DELTA in this case can be considered as a multiple of 8.3333 mS considering the potential measurement error. Effectively, step 272 determines if DELTA is a multiple of one-half line cycle (e.g., without limitation, about 8.3 mS). M represents the digit after the digit point, such as, for example, M=2 for 3.24 or M=8 for 5.82. If the test passes at 272 and DELTA is a multiple of one-half line cycle, then, at 274, one is added to an X bucket. On the other hand, if DELTA is not a multiple of one-half line cycle, then, at 275, one is added to a Y bucket.

After steps 274 or 275, or if the test failed at 262, then at 276, it is determined if Tn is greater than or equal to a predetermined time (e.g., without limitation, 200 mS; 2 S; 10 S; one day). If so, then at 278 and 280, the routine 250 checks two criteria before it declares that the noise is induced by an electrical conductivity fault, such as a glowing contact. Step 278 checks if X+Y>=A (e.g., without limitation, 10; 15; any suitable value); and step 280 checks if the ratio of X/(X+Y) >B (e.g., without limitation, 60%; any suitable percentage less than 100%). If these two tests pass, then an alarm (e.g., the fault indicator 158 of FIG. 3) is activated at 282. Otherwise, if one or both of these two tests fail, or after 282, the routine 250 causes a reset after cycling of power (e.g., if power from the power supply 162 of FIG. 3 cycles; if a manual power switch (not shown) is cycled), then values Y, X, Tn and Tn−1 are reset to zero and ΔT is set to 5 mS at 284, and the next interrupt is enabled at 286. Step 286 is also executed if any of the tests fail at 260, 266 and/or 276. Interrupts occur periodically (e.g., without limitation, every 100 μS). Also, the X and Y buckets of respective steps 274 and 275 are reset to zero after a predetermined time (e.g., without limitation, 10,000 mS; any suitable time).

The example routine 250 is similar to those of U.S. Pat. No. 7,148,696. However, it adds various features such as, for example, the L2 threshold in order to confirm that the wavelet contour is correct for each acoustic signal.

As will be discussed in connection with FIGS. 6-8, at least one of the acoustic sensors, such as 110 of FIG. 2, can be structured to clamp-on an electrical power conductor, such as 166 of FIG. 3. For example, the three acoustic sensors 42, 44, 46 can be structured to clamp-on a set of the three-phase electrical power conductors of phases 48,50,52, respectively, of FIG. 1.

Figure 6:
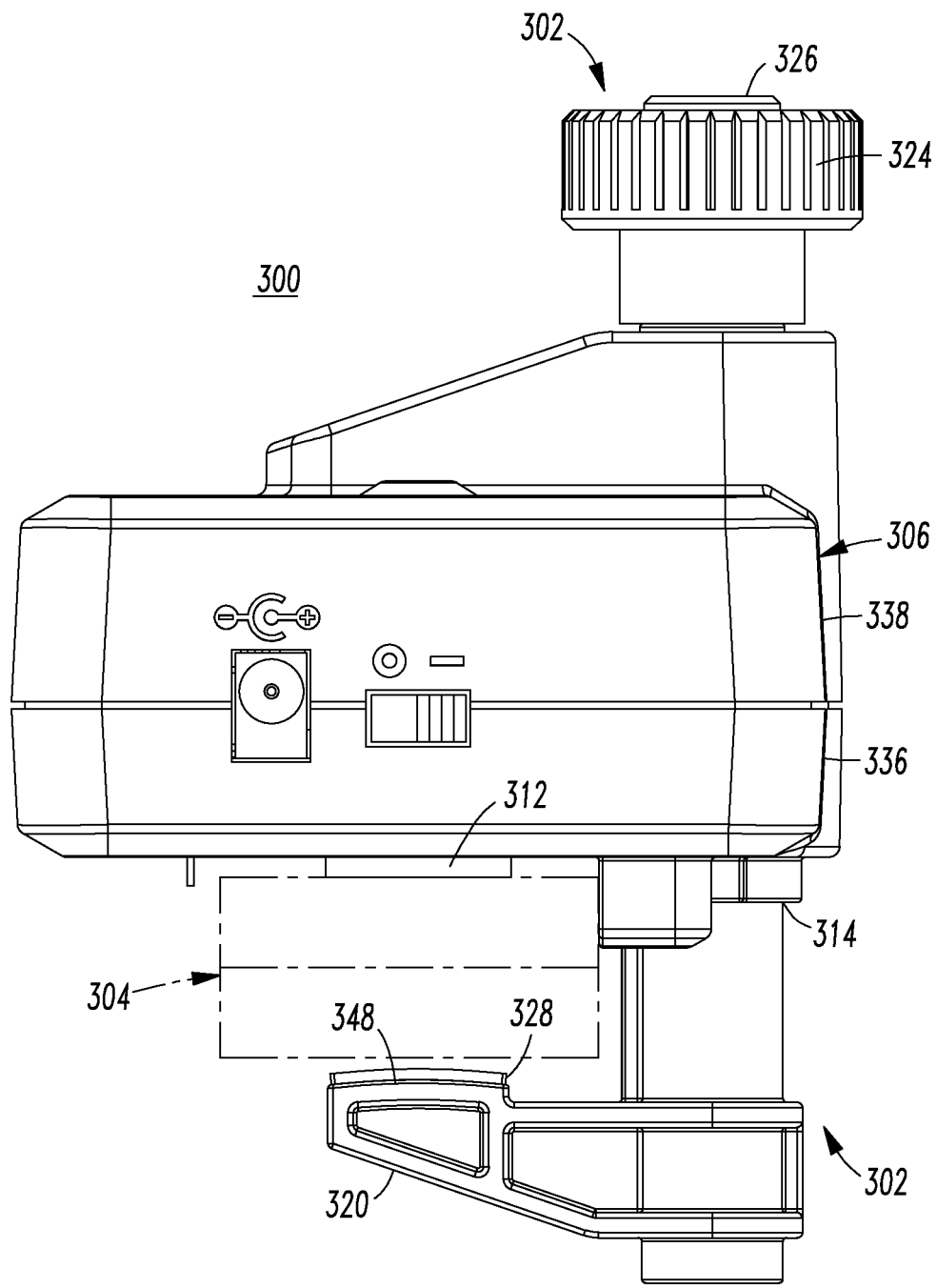
FIG. 6 is a vertical elevation view of an acoustic sensor including a clamp-on structure for a rectangular power bus bar in accordance with another embodiment of the disclosed concept.
Figure 7:
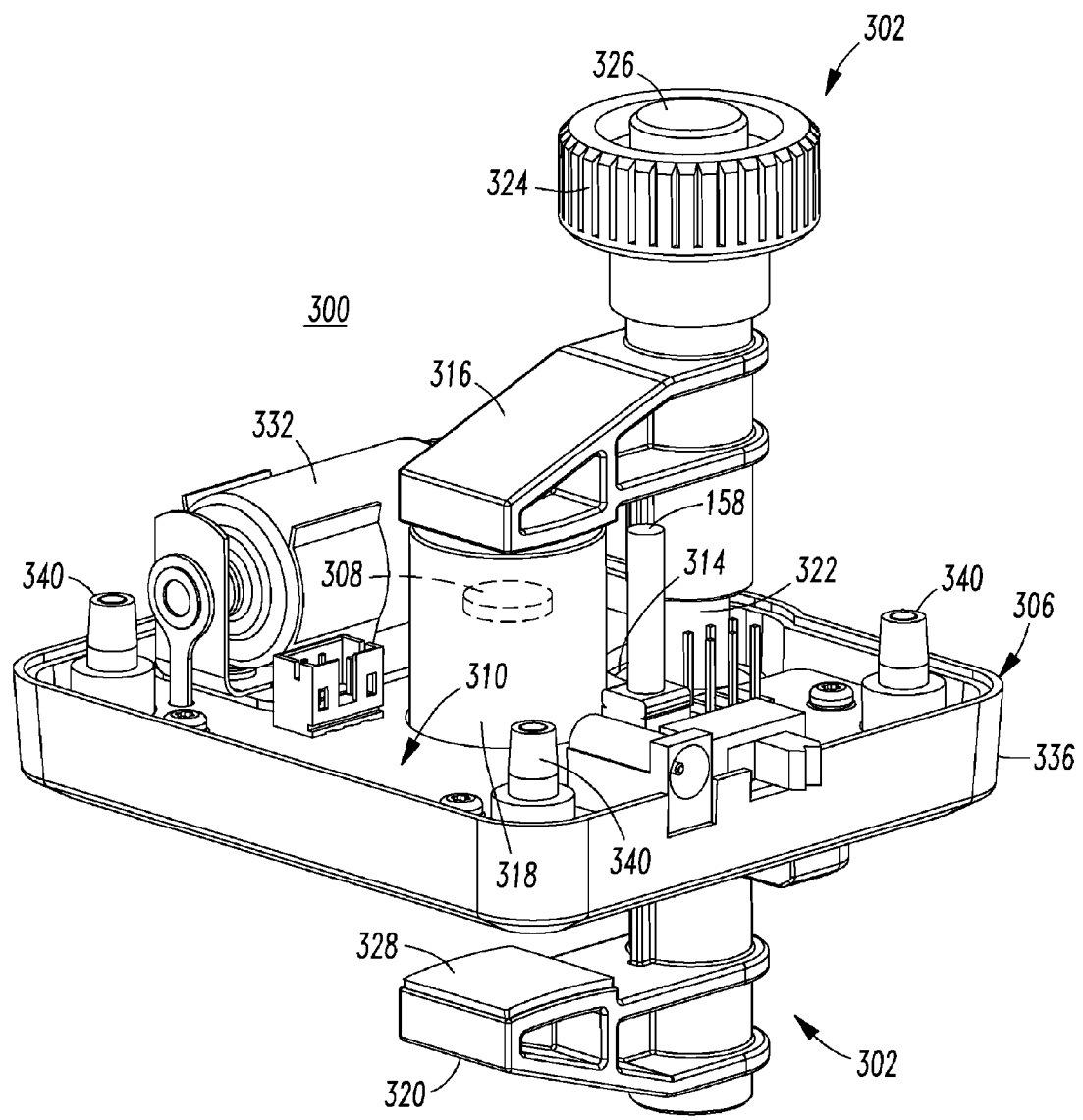
FIG. 7 is an isometric view of the acoustic sensor of FIG. 6 except with the cover removed to show internal structures.

Referring to FIGS. 6 and 7, an acoustic sensor apparatus 300 includes a clamp, such as the example clamp-on structure 302, for an electrical power conductor, such as the example rectangular power bus bar 304 (shown in phantom line drawing in FIG. 6). The example acoustic sensor apparatus 300 also includes a housing 306 for an acoustic sensor and/or an acoustic generator, such as a low cost piezoelectric element 308 (shown in hidden line drawing in FIG. 7) housed within the housing 306, and a printed circuit board (PCB) 310 (FIG. 7), which can include the example electronic circuit 14, fault indicator 158, wireless transceiver 160, parasitic power supply 162 and reset circuit 184 of FIG. 3. The housing 306 is clamped onto power bus bar 304 or another power conductor in an electrical system (not shown).

As shown in FIG. 6, the exterior of the housing 306 includes an insulation spacer 312, which is coupled to the stainless steel cylindrical canister 318 wherein piezoelectric element 308 (shown in hidden line drawing) is disposed (FIG. 7). The clamp-on structure 302 is structured to clamp together the insulation spacer 312 and the example power bus bar 304 along with the housing 306.

The housing 306 can be, for example and without limitation, a metallic housing or an insulative housing having an internal and/or external metal coating structured to provide EMI shielding. The metal coating can be, for example and without limitation, a suitable thin film metal coating.

As is best shown in FIG. 7, the example clamp-on structure 302 is disposed through opening 314 of the housing 306. The clamp-on structure 302 includes a first insulative clamp portion 316 disposed within the housing 306 and engaging a stainless steel cylindrical canister 318 that houses the piezoelectric element 308 (shown in hidden line drawing) therein, a second insulative clamp portion 320 disposed outside of the housing 306 and being structured to engage the power bus bar 304 (FIG. 6), and a threaded coupler, such as the example threaded dowel 322, passing through the first clamp portion 316 and through the housing 306. The threaded dowel 322 has a first end and an opposite second threaded end (shown in FIG. 8) threadably coupled to the second clamp portion 320 (as shown with the second clamp portion 320' in FIG. 8).

A rotatable member, such as the example circular, insulative fastening knob 324, is coupled to and structured to rotate along the threaded dowel 322 in order to move up or down to pull or push the second clamp portion 320 and clamp or unclamp, respectively, the housing 306, the power bus bar 304 and the second clamp portion 320. An insulative screw cap 326 keeps the knob 324 from rotating off the first end of the threaded dowel 322.

Preferably, the second clamp portion 320 has an insulative cushion 328 structured to insulatively engage the power bus bar 304.

The piezoelectric element 308 is within the example 0.5" diameter stainless steel cylindrical canister 318 and is coupled to the bottom of the canister 318, which is opposite the side of the insulative spacer 312 (e.g., a ceramic disk) (FIG. 6).

As shown in FIG. 7, the example acoustic sensor apparatus 300 includes the fault indicator 158 of FIG. 3, which can be an LED indicator (e.g., without limitation, green flashing for normal operation; red flashing for detection of an electrical conductivity fault operatively associated with the power bus bar 304). An on/off switch 330 can enable or disable the power supply 162 of FIG. 3, which can include a battery 332 as shown in FIG. 7. Also, the power supply 162 can accept DC power from an external AC/DC or DC/DC power supply (not shown) through DC power input 334.

As can be seen from FIGS. 6 and 7, the example housing 306 includes a base 336 and a cover 338. The base 336 includes posts 340, which engage corresponding structures (not shown) of the cover 338.

Figure 8:
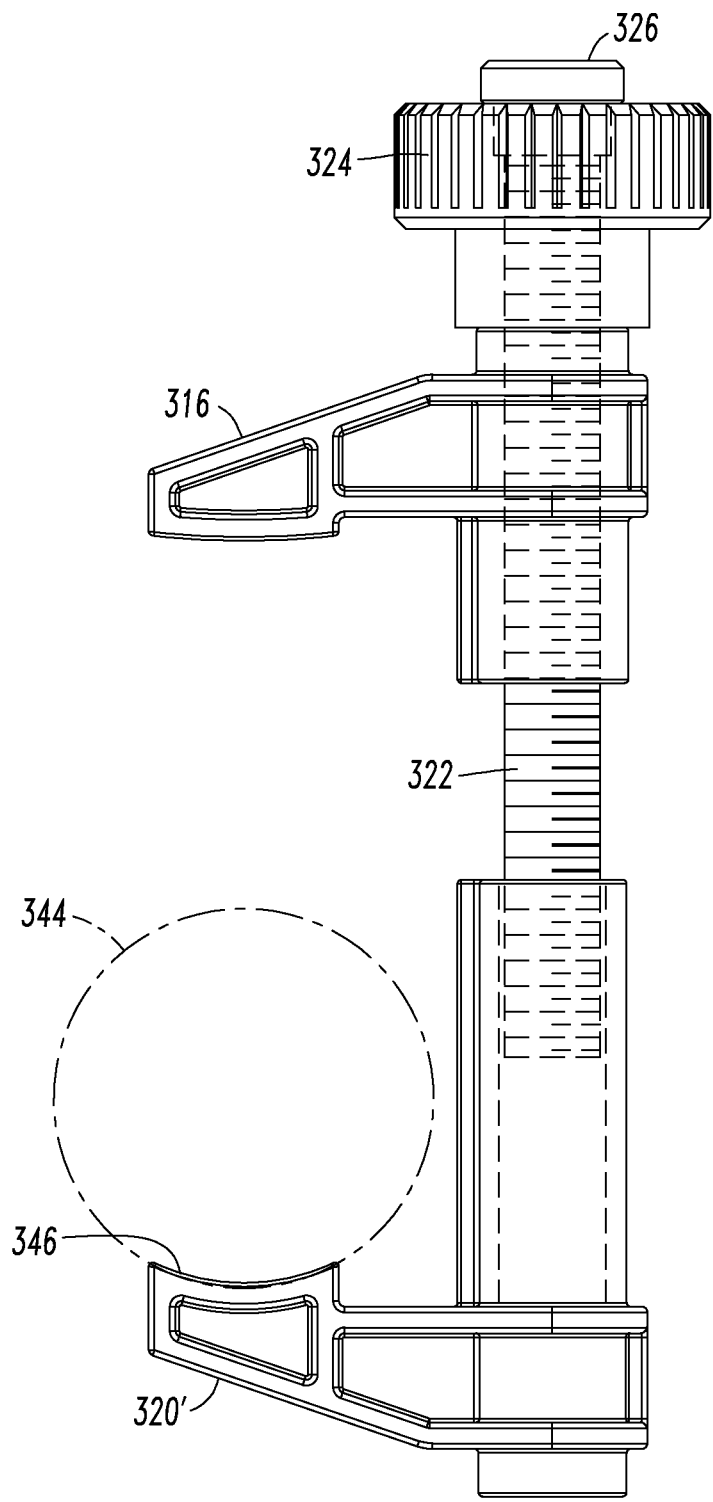
FIG. 8 is a vertical elevation view of a clamp-on structure for a power conductor and an acoustic sensor in accordance with another embodiment of the disclosed concept.

Referring to FIG. 8, another clamp-on structure 342 is for a power conductor 344 (shown in phantom line drawing in FIG. 8) and another acoustic sensor apparatus (not shown), which, except for the clamp-on structure 342, can be the same as or similar to the acoustic sensor apparatus 300 of FIGS. 6 and 7. The second clamp portion 320' is somewhat different than the second clamp portion 320 of FIG. 6. In particular, the clamp surface 346 is a concave arcuate surface to accommodate the circular or elliptical cross section of the power conductor 344. Conversely, the second clamp portion 320 of FIG. 6 has a flat, generally flat or somewhat convex surface 348 to accommodate the planar surface of the power bus bar 304. In this example, no insulative cushion is employed since electrical cables usually have insulative sleeves thereon. Otherwise, the clamp-on structure 342, like the clamp-on structure 302, can clamp together a housing, such as 306, the power conductor 344, and optionally an insulative spacer, such as 312.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An acoustic sensor system for an electrical distribution system having a number of phases, wherein said electrical distribution system is partitioned into a plurality of zones by a plurality of circuit interrupters that block acoustic propagation, and wherein each of said zones is a particular location or section of said electrical distribution system, said acoustic sensor system comprising:

a plurality of sets of acoustic sensors structured to detect an electrical conductivity fault of said electrical distribution system, wherein each of said plurality of sets includes a number of acoustic sensors, wherein each of said number of acoustic sensors is for a corresponding one of said number of phases of said electrical distribution system, and wherein a corresponding set of said plurality of sets of acoustic sensors is coupled to a number of electrical power conductors at a corresponding one of said zones of said electrical distribution system, in order that said plurality of sets of acoustic sensors are operatively associated with a plurality of the zones of said electrical distribution system.

2. The acoustic sensor system of claim 1 wherein said electrical distribution system comprises a plurality of bus bars and said plurality of zones; and wherein each of said number of acoustic sensors is coupled to a corresponding one of said bus bars at the corresponding one of said zones of said electrical distribution system, in order that said plurality of sets of acoustic sensors are operatively associated with all of the bus bars and all of the zones of said electrical distribution system.

3. The acoustic sensor system of claim 2 wherein each of said plurality of sets of acoustic sensors is structured to communicate with a remote station using a communication system to send an indication of the detected electrical conductivity fault and the corresponding zone of said plurality of zones upon detection of said electrical conductivity fault.

4. The acoustic sensor system of claim 1 wherein said electrical distribution system is a three-phase electrical distribution system comprising a plurality of bus bars and said plurality of zones; and wherein the corresponding set of said plurality of sets of acoustic sensors is coupled to three of said bus bars at the corresponding zone of said plurality of zones of said three-phase electrical distribution system, in order that said plurality of sets of acoustic sensors are operatively associated with all of the bus bars and all of the zones of said three-phase electrical distribution system.

5. The acoustic sensor system of claim 1 wherein each of said plurality of sets of acoustic sensors is further structured to periodically send a communication to a remote station using a communication system, in order to confirm normal operation thereof.

6. The acoustic sensor system of claim 1 wherein at least one of said plurality of sets of acoustic sensors is further structured to be powered by a power supply selected from the group consisting of a battery, a parasitic power source, and an external power source.

7. The acoustic sensor system of claim 1 wherein at least one of said number of acoustic sensors is structured to clamp-on at least one of said number of electrical power conductors of said electrical distribution system.

8. An acoustic sensor system for an electrical distribution system partitioned into a plurality of zones by a plurality of circuit interrupters that block acoustic propagation, each of said zones is a particular location or section of said electrical distribution system, each of said zones having a number of electrical connections, said acoustic sensor system comprising:
a plurality of acoustic sensors structured to detect an electrical conductivity fault of said number of electrical connections;
a remote station; and
a communication system between said acoustic sensors and said remote station,
wherein each of said acoustic sensors is structured to communicate with said remote station using said communication system to send an indication of the detected electrical conductivity fault and a corresponding zone of said plurality of zones upon detection of said electrical conductivity fault, and
wherein a corresponding set of said plurality of acoustic sensors is coupled to a number of electrical power conductors at a corresponding one of said zones of said electrical distribution system, in order that said acoustic sensors are operatively associated with a plurality of the zones of said electrical distribution system.

9. The acoustic sensor system of claim 8 wherein each of said acoustic sensors is further structured to periodically transmit a message to said remote station using said communication system, in order to confirm normal operation thereof.

10. The acoustic sensor system of claim 8 wherein said electrical distribution system is a three-phase electrical distribution system; and wherein said plurality of acoustic sensors are structured as a plurality of sets of three acoustic sensors, each of said three acoustic sensors being for a corresponding one of three phases of said three-phase electrical distribution system.

11. The acoustic sensor system of claim 8 wherein said electrical distribution system is a single-phase electrical distribution system.

12. The acoustic sensor system of claim 8 wherein said electrical distribution system comprises a plurality of bus bars; and wherein each of said acoustic sensors is coupled to a corresponding one of said bus bars at the corresponding one of said zones of said electrical distribution system, in order that said acoustic sensors are operatively associated with all of the bus bars and all of the zones of said electrical distribution system.

13. The acoustic sensor system of claim 8 wherein said remote station is a control center.

14. The acoustic sensor system of claim 8 wherein said remote station is a protective relay.

15. The acoustic sensor system of claim 8 wherein said communication system is selected from the group consisting of a wired communication system and a wireless communication system.

16. The acoustic sensor system of claim 8 wherein at least one of said acoustic sensors is further structured to be powered by a power supply selected from the group consisting of a battery, a parasitic power source and an external power source.

17. The acoustic sensor system of claim 8 wherein at least one of said acoustic sensors is structured to clamp-on at least one of said number of electrical power conductors.

* * * * *